United States Patent [19]

Mones et al.

[11] 4,172,907
[45] Oct. 30, 1979

[54] METHOD OF PROTECTING BUMPED SEMICONDUCTOR CHIPS

[75] Inventors: Arthur H. Mones; James E. O'Keefe, both of Phoenix, Ariz.

[73] Assignee: Honeywell Information Systems Inc., Phoenix, Ariz.

[21] Appl. No.: 865,546

[22] Filed: Dec. 29, 1977

[51] Int. Cl.² .................. B05D 5/12; H01L 21/88
[52] U.S. Cl. .................................. 427/96; 427/82; 427/88; 427/93; 427/240; 427/264; 427/270; 427/277; 427/379
[58] Field of Search ............. 427/82, 93, 240, 264, 427/270, 277, 379, 96, 88

[56] References Cited

U.S. PATENT DOCUMENTS

| | | | |
|---|---|---|---|
| 3,165,430 | 1/1965 | Hugle | 427/82 |
| 3,549,398 | 12/1970 | Watson | 427/277 |
| 3,663,277 | 5/1972 | Koepp | 427/240 |
| 3,730,751 | 5/1973 | Newberger | 427/270 |
| 3,978,578 | 9/1976 | Murphy | 427/82 |
| 4,017,340 | 4/1977 | Yerman | 427/82 |
| 4,115,602 | 9/1978 | Bullard | 427/270 |

Primary Examiner—Michael F. Esposito
Attorney, Agent, or Firm—Edward W. Hughes; William W. Holloway, Jr.; Ronald T. Reiling

[57] ABSTRACT

A method of protecting from physical damage the upper surface of medium and large scale integrated IC circuit chips. Certain types of IC chips are provided with a plurality of input/output terminals, or bumps, which project above the upper surface of the chips on which they are formed. The upper surface of each such chip, including its bumps, are spin coated with a thin adhesion promoter which is then dried. The chips and its terminals are next spin coated with a layer of a heat curable resin which is partially cured. The resin and the adhesion promoter are then removed from the upper surfaces of the bump by rubbing with a soft abrasive material. The resin remaining on each IC chip is then finally cured.

5 Claims, 2 Drawing Figures

METHOD OF PROTECTING BUMPED SEMICONDUCTOR CHIPS

CROSS REFERENCE TO RELATED APPLICATION

The following copending application is related to the present application and is incorporated hereby by reference. It is Honeywell Information System Inc. application entitled "Terminal Pad Scrubber" by Neil F. Jensen Ser. No. 865,545, filed Dec. 29, 1977, which application is assigned to the same Assignee as the present invention.

BACKGROUND OF THE INVENTION

1. Field of the Invention

This invention relates to methods of providing protection to the upper surfaces of integrated (IC) chips, particularly those having input/output terminals, which project above the upper surface of the chip and IC chips provided with such protective layers. The purpose of the protective layer is to protect the upper surface of the chip from physical damage as the result of the subsequent handling and testing, encountered in incorporating them into electronic systems.

2. Description of the Prior Art

The development of integrated circuit chips, particularly medium and large scale integrated circuit chips, has led to new ways of handling and packaging or mounting them so that they can be assembled to provide functional circuits in electronic subsystems of digital data processing computers, for example. To facilitate handling and packaging such chips each chip is bonded to a lead frame, which lead frames are formed on relatively long tape-like carriers such as standard motion picture film. IC chips bonded to lead frames formed on such carriers are provided with I/O terminals, or bumps, which are welded or soldered to the free ends of the individual leads of each flexible lead frame. An IC chip and a portion of its lead frame is then excised from the segment of the film strip to which the frame is attached, the leads are formed, and the chip and its formed leads are mounted on a ceramic substrate of a reasonable size, from one square inch to sixteen square inches, for example, with large numbers of IC chips, up to one hundred, being mounted on one such substrate having an area of substantially nine square inches. IC chips mounted on substrates in this way are not encapsulated or provided with an individual protective housing as they are when handled as discrete components.

It is standard practice in the semiconductor industry to protect the upper surface of each IC chip with a thin layer of SiO₂, or protective glass, which is quite thin, on the order of 1 to 3 microns in thickness. A reason why protective glass coatings are made so thin is to permit I/O openings to be etched through the glass whenever an I/O terminal is to be connected to an underlying conductor. In addition, increasing the thickness of the glass layer increases the stresses between the glass layer and the underlying material due to differences in their thermal coefficients of expansion.

Some IC chips are provided with input/output terminals, or bumps, preferably made of gold, which project a substantial distance above the layer of glass, on the order of from 15 to 26 microns. It is of course desirable that the outer surfaces of the bumps be substantially coplanar with the outer surface of the chip, to facilitate automating the process of bonding leads to said bumps. It is also necessary that the outer surface of the bumps be clean so that a good bond, or solder joint, between a bump and its lead can be produced reliably and economically.

To minimize damage to the protective glass layer, the prior art, as known to Applicants, has developed thin resilient coatings which have heretofore been produced using photolithographic techniques. Some of the problems attendant with photo techniques for establishing protective layers are the result of the chemicals used in the process, solvents, and strippers. Further, only a limited number of materials are compatible with photolithographic techiques. In addition, the thickness of the protective layers is limited by the photolithographic process substantially to that of the protective glass layer which does not protect the glass, or passivation, layer from physical damage as well as a thicker layer. The reason such photolithographic techniques have been used in the past is that it is essential that the I/O terminals or bumps of IC chips not be covered or contaminated by any such protective layer, otherwise reliable connection of leads to the terminals of an IC chip cannot be produced.

A problem associated with manufacturing electronic systems using bumped chips bonded to flexible beam leads on a tape carrier and subsequently excising them from the tape and mounting them on a substrate is that each chip must go through a number of manufacturing steps from the time the bumps are formed in the process of manufacturing the chips, which is normally before the chips are separated from one another, until they are mounted on a substrate and the substrate is mounted in an electronic system. During any one of these steps the very thin layer of protective glass is easily damaged by chip-to-chip impact, tweezers, and probes. Because of the thinness of the glass layer, a very small force will produce cracks in or damage to the glass layer. This damage can trap contaminants which may be corrosive to the underlying metal layer, normally aluminum, and such contaminants can also serve as condensation nuclei for water vapor that may condense on the chips. Cracks in the protective glass layer can also be transmitted to the metal underlying the glass which in turn can crack or lift from the silicon substrate of the IC chip. Any of these occurrences can chemically or mechanically degrade the metal layer of the chip. There is evidence that about half of the electrical failures associated with aluminum corrosion of the metallized layer of IC chips are the result of a scratch or crack in the protective glass layer. Additional layers of protective material that heretofore have been applied to protect such a glass layer have been too thin because of the techniques of applying them and the need to keep the I/O terminals clean and accessible. As a result they provide little if any improvement in resistance of the glass coating to being cracked during manufacturing from the time the bumps are formed until the IC chip is mounted on a substrate.

SUMMARY OF THE INVENTION

The present invention provides a coating of a protective material several times thicker than previous protective coatings applied to the glass coating on the metallization layers of IC chips. The coating is uniformly applied, preferably by spin coating; and depending upon the nature of the resinous material applied, the outer surfaces of the chips and their bumps, while still an integral part of the silicon wafer on which the chips were produced, may be precoated with an adhesive promoting substance such as colloidal silica. The chips are then provided with a relatively thick protective coating of a curable organic resin. The thickness of the protective coating preferably is slightly less than the thickness, or height, of the bumps above the upper surface of the passivation layer of the IC chips. The thickness of the coating of resinous material is preferably in the range of from 50% to 95% of the height of the bumps. The protective coating is then partially cured by heating, for example, and the protective resinous coating and the adhesion promoting material, if used, are removed from the top surfaces of the bumps, or I/O terminals, by a soft abrasive material such as an eraser. The protective coating is then fully cured. As a result, a resilient protective organic coating several times thicker than the protective glass coating is formed on top of the glass layer of the IC chip while the top surfaces of the bumps of the chips are fully exposed and clean so that leads can be bonded to them without further cleaning of the bumps. While the protective coating is provided to protect the protective glass layer of the integrated circuit chip from mechanical damage, it also provides some protection from moisture and inhibits the formation of electrical short circuits between bumps if the leads of a lead frame are soldered to the bumps. The organic protective coating also prevents the formation of a continuous water film on the glass surface and inhibits moisture transmission to the glass layer. The coating can also be pigmented to prevent light from reaching the top surface of the chips if desired.

It is therefore an object of this invention to provide a method by which integrated circuit chips are provided with a protective coating which significantly reduces the risk of physical damage to a chip during manufacture and subsequent use of electronic devices.

It is a further object of this invention to provide a method by which integrated circuit chips with raised I/O terminals are provided with a protective coating whose thickness is substantially equal to the height of the terminals, but which coating does not interfere with the formation of strong connections having low electrical impedance between the terminals and leads bonded to the terminals.

It is still another object of this invention to provide a method for applying a coating of a curable resinous material to all the chips formed on a silicon wafer at one time after the chips have been provided with a protective glass coating and their I/O bumps have been formed, and which protective coating covers and protects the glass coating from physical damage while the top surfaces of the I/O bumps are clean and uncovered.

It is still a further object of this invention to provide a method of reducing physical damage to the protective glass layer of bumped IC chips which also inhibits shorts between the bumps and provides increased resistance to chemical attack.

BRIEF DESCRIPTION OF THE DRAWINGS

Other objects, features, and advantages of the invention will be readily apparent from the following description of a preferred embodiment thereof taken in conjunction with the accompanying drawings, although variations and modifications may be effected without departing from the spirit and scope of the novel concepts of the disclosure and in which.

DESCRIPTION OF THE PREFERRED EMBODIMENT

Figure 1:
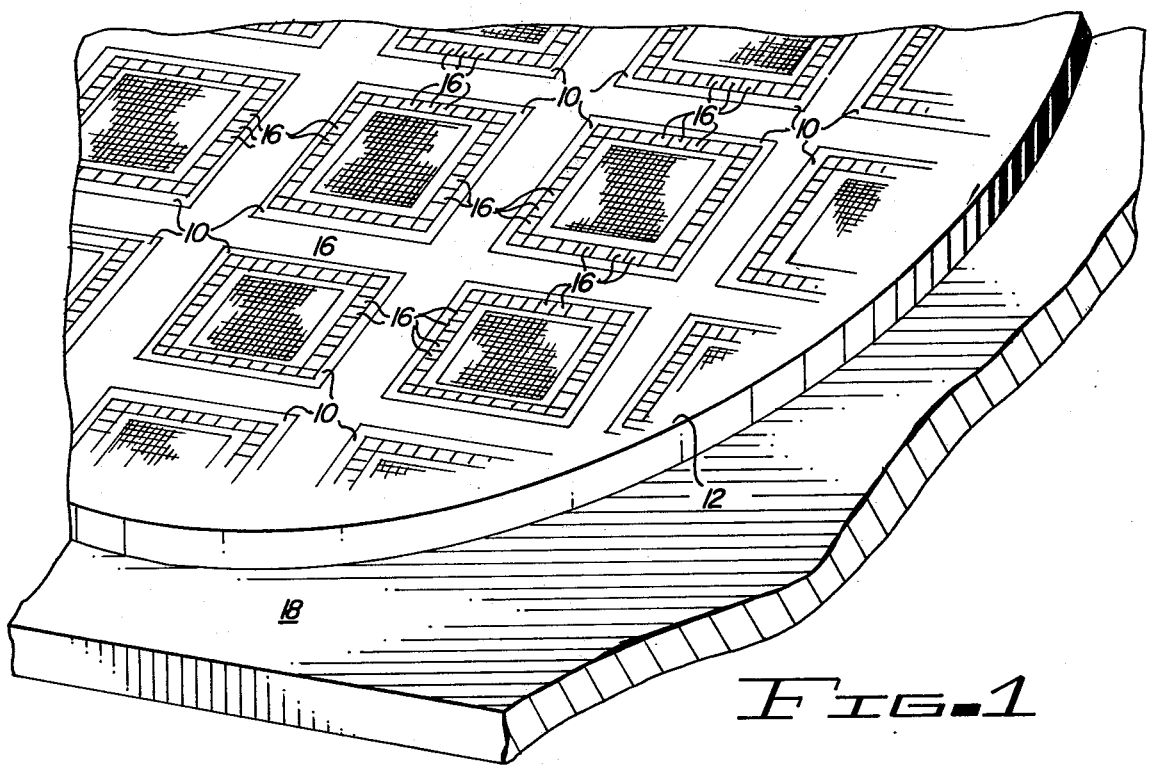
FIG. 1 is a perspective view, greatly enlarged, of a portion of a silicon wafer mounted on a handling plate with integrated circuit elements and their I/O terminals, or bumps, having been formed.

In FIG. 1 a plurality of large scale integrated circuit elements 10, for example, are illustrated. These elements 10, which when separated are referred to as chips, are still integral with wafer 12 on which they are formed. The IC elements 10 on wafer 12 have preferably reached that stage in the process of producing them where a thin passivation layer of glass 14 and I/O terminals, or bumps 16, have also been formed, see FIG. 2. The elements, or chips, 10 have not yet been cut apart. After they are separated, they are commonly referred to as chips. Wafer 12 and each IC element 10 formed on it are now ready to have a protective coating applied. Wafer 12 is mounted on a handling plate 18 to reduce the risk of damage to the wafer and the elements 10 formed on it primarily when the elements 10 are cut, or sawed apart.

In the preferred embodiment the type of organic coating which is used to protect glass coating 14 of each element 10 is a polyimide such as is obtained from Pyre-ML, a product of the DuPont Company. To improve the adhesion of the polyimide to glass layer 14, the upper surface 20 of the glass layer 14, which is also the upper surface of the element 10, and the bumps 16 of each element 10 are precoated with a very thin layer 22 of an adhesive promoter such as colloidal silica. A suitable source of such colloidal silica is Cab-O-Sil, a product of the Cabot Corporation. Layer 22 of the adhesive promoter is preferably formed by conventional spin coating techniques by mounting handling plate 18 on a conventional spinning table such as that manufactured by Headway Research, Inc. and spinning handling plate 18 for approximately 50 seconds at 2000 rpm after applying a few drops of the adhesion promoter, an aqueous solution of colloidal silica 2% by weight, to the center of the wafer 12. Wafer 12 is then dried at a temperature of around 100° C. After layer 22 is dry, layer 24 of a curable organic resin is then formed on the exposed upper surfaces of the wafer 16, particularly the circuit elements 10 formed on it. In a preferred embodiment an appropriate amount of DuPont's Pyre-ML, a solution of polyamic acid in N-methyl-2-pyrrolidone, is deposited on wafer 12, and wafer 12 is then spun at substantially 6000 rpm for 50 seconds. The resin of layer 24 is then partially cured by placing wafer 12 in an oven at approximately 125° C. for substantially one-half hour. Wafer 12 is then abraded with a vinyl eraser. The type of eraser used is manufactured and sold by the Faber-Castell Corporation under the trade name of Magic-Rub #1954. The eraser is used to remove layers 24 and 22, the coating of the polyimide and the colloidal silicon, from the top surfaces 26 of the bumps 16 of each of the elements 10 of wafer 12. The resin forming layer 24, after the abrading step is completed, is then finally cured by placing wafer 12 in an oven for one-half hour at 275° C. Wafer 12 is then ready for each of the IC elements 10 to be tested to identify those that are good, or meet specification, and those that do not if this test was not conducted earlier. The nonacceptable chips are appropriately marked; and handling plate 18 with wafer 12 still attached is ready for the next step in the manufacturing process which normally is to saw up wafer 12 to separate the IC elements 10 into IC chips 10. The good chips are then bonded to lead frames, etc.

Tests were run on the fail strengths of copper leads bonded to I/O bumps or terminals 16 of chips 10 produced by the process described above. The leads typically fail at pull strengths of around 50 grams which indicates that the bumps or I/O terminals 16 of each of the chips 10 are adequately cleaned by the above described method.

Figure 2:
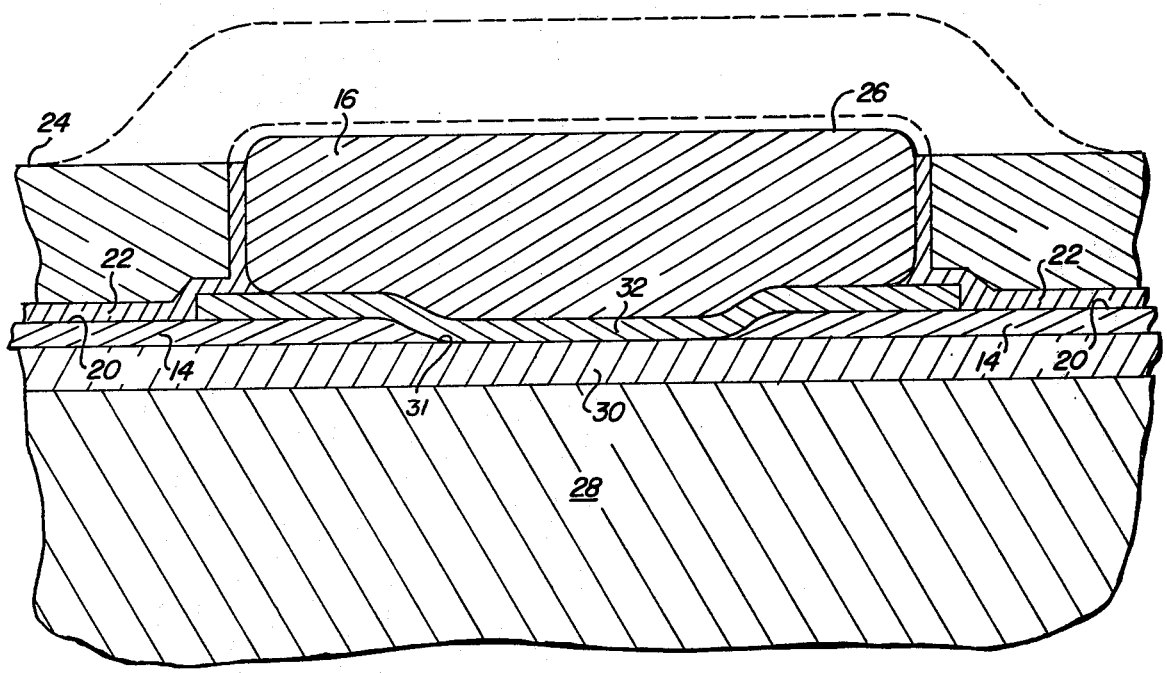
FIG. 2 is a fragmented sectional view taken on lines 2—2 of FIG. 1 at a greatly enlarged scale.

Referring to FIG. 2, substrate 28 of the chip 10 is made of pure silicon and metalization layer 30 is typically made of aluminum. The metalization layer 30 is covered by a thin passivation layer of glass 14 with I/O openings 31 formed in layer 14 where a bump 16 is to be formed and placed in electrical contact with aluminum layer 30. Openings 31 in glass layer 14 are usually formed using photolithographic processes. Contact between a bump 16 which in a preferred embodiment is made of gold, is preferably by a palladium titanium boundary layer 32 which is also delineated by photolithographic processes after deposition by sputtering, for example. All of the bumps 16 on a chip 10 have a substantially uniform height, or they project a substantially uniform distance above the upper surface 20 of chip 10, the upper surface of glass layer 14. Typically this height is substantially 25 microns. Glass layer 14 usually has a thickness in the range of from 1 to 3 microns. The upper surfaces 26 of bumps 16 are substantially planar and coplanar with the upper surface 20 of glass layer 14.

When the initial coating of adhesive promoter is applied by spin coating, layer 22, which is very thin, substantially covers all of the glass layer 14 as well as the exposed surfaces of each of the bumps 16 as indicated in FIG. 2. After layer 22 of colloidal silica has been dried, a thicker layer 24 a polyimide is spin coated over the surface of the wafer 12 including all of the elements 10 and bumps 16 of those elements. The polyimide in layer 24 is partially cured so that it is relatively easy to remove that portion of polyimide layer 24 overlying the upper surfaces 26 of bumps 16 by using a soft abrasive material such as a polyvinyl eraser. The erasing or removing of polyimide layer 24 from the top surfaces 26 of bumps 16 can be accomplished either by hand or by use of a "Terminal Pad Scrubber" such as is described in the application filed concurrently with this application which application is identified in the portion of this application entitled "Cross Reference to Related Applications."

The height of the bumps 16 of each chip 10 above the upper surface 20 as mentioned earlier is approximately 25 microns. The thickness of the two layers 22 and 24, or the total thickness of the protective layer, is preferably slightly less than the height of the bumps 16, on the order of 12 to 22 microns. The cleaning step of the method removes layers 22 and 24 from the top surfaces 26 of bumps 16, but does not remove any substantial portion of protective layer 24 directly over glass layer 14 since the top surface of layer 24 is slightly below the top surfaces 26 of bumps 16. Thus layer 24 is on the order of seven or more times thicker than glass layer 14 and is sufficiently thick and resilient to provide a significant increase in the physical protection afforded to glass layer 14 in those processes requiring handling or contact with an IC chip 10.

While the preferred method uses a polyimide, a heat curable resin, and a layer of a colloidal silica as an adhesion promoter, other resins such as acrylics, urethanes, isoprene and copolymers of polyimides and silicones which adhere well to glass layer 14 can be used to form protective layer 24 without the necessity of an adhesion promoter being first applied.

It is preferable to partially cure the resin used to form protective layer 24 to facilitate the removal of this layer over the bumps 16 before final curing of the resin. It is of course desirable that the protective layer 24 be chemically compatible with the materials with which it comes in contact.

From the foregoing it is seen that Applicants have provided a process that provides a substantially thick resilient protective layer of a nonfrangible material, such as a curable organic resin, which significantly reduces the risk of damage occurring to the glass layer of bumped IC chips from mechanical forces applied to them, in the processes of testing and mounting them in an electronic circuit. While such a protective layer protects glass layer 14, it obviously also protects the underlying metalization layer 30. As a result the reliability of IC chips so protected is significantly enhanced since the presence of a thick protecting organic layer also increases their resistance to corrosion in the environment in which they are ultimately used.

It should be evident that various modifications can be made to the described method without departing from the scope of the present invention.

We claim as our invention:

1. A method of protecting from physical damage an integrated circuit chip having a substantially planar upper surface, a plurality of I/O bumps formed on said upper surface, each of said bumps having a top surface projecting a substantially uniform distance above the upper surface of the chip, said method comprising the steps of:

applying a coating of a curable resin adherable to the upper surface of the chip, said coating having a substantially uniform thickness over the upper surface of the chip and covering the top surfaces of the I/O bumps of the chip, the thickness of the coating on the upper surface of the chip being slightly less than the distance the bumps project above the upper surface;

partially curing the resin;

removing the partially cured resin from the top surfaces of the bumps by mechanical means; and final curing of the resin remaining on the chip.

2. A process for protecting from physical damage integrated circuit elements having substantially planar upper surfaces, a plurality of I/O bumps formed on the upper surface of each of said elements, said bumps projecting above the top surface of each of said elements, said bumps of each element each having a top surface substantially coplanar with and at a substantially equal height above the upper surface of the element on which said bumps are formed, said process comprising the steps of:

applying a thin first coating of substantially uniform thickness of an adhesion promoter over the upper surface of each of the elements and the bumps projecting above the upper surface of each of said elements;

applying a second coating of a curable resin of substantially uniform thickness over said first coating, the thickness of the first and second coatings above the upper surface of each of said elements being less than the height of the bumps of each of said elements;

partially curing the second coating;

removing the partially cured second coating and the first coating from the top surfaces of the bumps of each element by mechanical means; and final curing of the second coating of each element.

3. A process for protecting from physical damage an integrated semiconductor circuit chip having a substantially planar upper surface, a plurality of I/O bumps formed on said upper surface, each of said bumps having a top surface substantially coplanar with the upper surface of the chip and spaced above the upper surface a substantially uniform distance, said process comprising the steps of:

applying a coating of a resin of substantially uniform thickness over the chip and its bumps, the thickness of said coating above the planar upper surface of the semiconductor chip being slightly less than the distance the top surfaces of the bumps are spaced above the upper surface of the chip;

partially curing the second coating;

removing the partially cured resin from the top surfaces of the bumps by mechanical means; and final curing of the second coating.

4. A method for protecting from physical damage elements of electronic circuits formed on a semiconductor wafer, each element having a substantially planar upper surface, a plurality of input/output terminal bumps formed on the upper surface of each of said elements, each of the bumps having a top surface, the height of the top surfaces of the bumps of each element above the upper surface of the element on which the bumps are formed being substantially equal, said method comprising:

spin coating a layer of a thermally curable resin on the wafer, the thickness of the layer above the planar top surface of each of the elements being slightly less than the height of the bumps of each of said element;

heating the wafer to a predetermined range of temperature to partially cure the said coating;

rubbing a soft eraser over the top surface of said layer to remove the said layer from the top surface of the bumps; and heating the wafer and its coatings to a predetermined range of temperatures for a predetermined period of time to substantially completely cure said coating.

5. A method for protecting from physical damage elements of electronic circuits formed on a semiconductor wafer, each element having a substantially planar upper surface and a plurality of input/output bumps formed on the upper surface of each of said elements, each of the bumps having a top surface, the height of the top surfaces of the bumps of each of said element above the upper surface of the element on which the bumps are formed being substantially equal, said method comprising:

spin coating the top surface of the elements of the wafer and their I/O bumps with a thin first layer of colloidal silica;

drying the layer of colloidal silica;

spin coating said first layer with a second layer of a thermally curable polyimide, the thickness of the first and second coatings above the planar upper surface of each of the elements being slightly less than the height of the bumps of said element;

heating the wafer and its coatings to partially cure the second coating;

rubbing a soft abrasive material over said elements to remove said first and second layers from the top surfaces of the bumps; and heating the wafer to substantially cure said second coating.

* * * * *